US00RE40939E

(19) United States
(12) Reissued Patent
Huang

(10) Patent Number: US RE40,939 E
(45) Date of Reissued Patent: Oct. 20, 2009

(54) MULTI-PHASE LOCKED LOOP FOR DATA RECOVERY

(75) Inventor: Chen-Chih Huang, Hsinchu (TW)

(73) Assignee: Realtek Semiconductor Corporation, Hsinchu (TW)

(21) Appl. No.: 10/929,152

(22) Filed: Aug. 27, 2004

Related U.S. Patent Documents

Reissue of:

(64) Patent No.: 6,442,225
Issued: Aug. 27, 2002
Appl. No.: 09/332,066
Filed: Jun. 14, 1999

(51) Int. Cl.
*H03D 3/24* (2006.01)

(52) U.S. Cl. ..... 375/376; 375/374

(58) Field of Classification Search ..... 375/376, 375/374; 327/156, 147, 153
See application file for complete search history.

(56) References Cited

U.S. PATENT DOCUMENTS

| | | | | | |
|---|---|---|---|---|---|
| 4,109,102 | A | * | 8/1978 | Yoshida et al. | 375/332 |
| 4,535,459 | A | * | 8/1985 | Hogge, Jr. | 375/324 |
| 5,408,200 | A | * | 4/1995 | Buhler | 331/1 A |
| 5,799,048 | A | * | 8/1998 | Farjad-Rad et al. | 375/360 |
| 6,026,134 | A | * | 2/2000 | Duffy et al. | 375/376 |
| 6,314,151 | B1 | * | 11/2001 | Fukaishi | 375/376 |

* cited by examiner

*Primary Examiner*—Kevin Y Kim
(74) *Attorney, Agent, or Firm*—Thomas, Kayden, Horstemeyer & Risley

(57) ABSTRACT

The present invention provides a multi-phase-locked loop without dead zone, which can reduce clock jitter and provide larger tolerance for data random jitter. It generates and output multiple sets of control signals ($up_k/dn_k$) via a multi-phase voltage controlled oscillator which generates a plurality of multi-phase clock signals for detecting the transition edge of data signal. Therefore, the phase error $\theta_e$ and the voltage Vd of the multi-phase-locked loop can be adjusted to be nearly linear according to the control signals. A multi-phase-locked loop without dead zone thus can be provided.

19 Claims, 8 Drawing Sheets

MULTI-PHASE LOCKED LOOP FOR DATA RECOVERY

Matter enclosed in heavy brackets [ ] appears in the original patent but forms no part of this reissue specification; matter printed in italics indicates the additions made by reissue.

FIELD OF THE INVENTION

The present invention relates generally to a phase-locked loop for data recovery, and more particularly, to a multi-phase-locked loop that utilizes a multi-phase clock signal generated by a multi-phase voltage controlled oscillator (VCO) to detect received data.

BACKGROUND OF THE INVENTION

Due to the development of the network transmission technology as well as the demands in the installed base of computer networks, the network data transmission rate in hardware environment has been increased. Therefore, it becomes more and more important to recover data (clock signals) correctly.

At present, while data (clock) recovery is to be performed, a phase-locked loop is often utilized. During the data recovery process, usually the received data could be correctly recovered (read) by using a phase detector to synchronize the received data and recover the clock. In other words, the phase detector plays a very important role whether the data could be correctly recovered by a phase-locked loop.

FIG. 1 illustrates a prior art phase-locked loop for data recovery comprising a phase detector 11, a charge pump 12, a loop filter 13, and a voltage controlled oscillator 14. The phase detector 11 is used to receive a data (clock) signal from outside as well as a feedback clock signal $CK_{vco}$ from the voltage controlled oscillator 14. The phase detector 11 compares the two signals, in accordance with their phase difference $\theta_e$ ($\theta_e=\theta_{data}-\theta_{clock}$), a control signal up or dn will be output to control the charge pump 12. As shown in FIG. 2(a), when the transition edge of the data (clock) signal data leads the falling edge of the feedback clock signal $CK_{vco}$, the phase detector outputs an up signal. On the other hand, as shown in FIG. 2(b), when the transition edge of the data (clock) signal data lags behind the falling edge of the feedback clock signal $CK_{vco}$, the phase detector 11 outputs a dn signal. The charge pump 12 is controlled by the up and dn control signals output from the phase detector 11 to perform charge/discharge operations, and generates a voltage signal Vd. The loop filter 13 receives the voltage signal Vd and generates an appropriate voltage Vc for controlling the voltage controlled oscillator 14. The voltage controlled oscillator 14 receives the voltage Vc and generates a clock signal $CK_{vco}$ to be input to the phase detector 11.

As shown in FIG. 3, the phase detector 11 of the phase locked loop 1 is constituted by four flip-flops 111, 112, 113, 114, and two OR gates 115, 116. The flip-flops 111 and 112 receive the complement of data from outside (denoted by $\overline{\text{data}}$) and the data itself (denoted by data), respectively. The clock signal $CK_{vco}$ from the voltage controlled oscillator 14 is applied to the inversion reset terminals (rb) of the flip-flops 111 and 112 such that two control signals up1 and up2 are generated, respectively. The flip-flops 113 and 114 receive the complement of data from outside (denoted by $\overline{\text{data}}$) and the data itself (denoted by data), respectively. The complement of the clock signal $CK_{vco}$ (denoted by $\overline{CK_{vco}}$) from the voltage controlled oscillator 14 is applied to the inversion reset terminals (rb) of the flip-flops 113 and 114 such that two control signals dn1 and dn2 are generated, respectively. According to the two signals $up_1$ and $up_2$, the OR gate 115 generates a control signal up for controlling the charge pump 12 (refer to FIG. 2(a)). Similarly, the OR gate 116 generates a control signal dn for controlling the charge pump 12 according to the two signals $dn_1$ and $dn_2$ (refer to FIG. 2(b))

Referring to FIG. 1, the voltage Vd is substantially controlled by the signals (up, dn). In other words, the variation of the control voltage Vd is related to the phase error $\theta_e$. FIG. 4 illustrates the relation between the variation of Vd and the phase error $\theta_e$. As shown in FIG. 4, when the data signal data has a phase lagging behind the clock signal $CK_{vco}$, the smaller the phase error $\theta_e$ is, the more the voltage Vd varies. Therefore, phase error $\theta_e$ is theoretically supposed to approximate to zero and closely moves around the origin when the phase-locked loop is going to enter a phase-locked state. However, due to the above phenomenon, when the data signal data of the phase-locked loop has a phase lagging behind the clock signal $CK_{vco}$, an obvious variation of Vd will be generated, which leads to clock jitter. And, the tolerance for data random jitter becomes worse. In other words, it is difficult to reduce the clock jitter for conventional phase-locked loops, large data random jitter is thus unaccepted.

SUMMARY OF THE INVENTION

It is therefore an object of the present invention to provide a multi-phase-locked loop without dead zone, which can reduce clock jitter and provide higher tolerance for data random jitter.

Another object of the present invention is to provide a multi-phase-locked loop without static phase error.

The present invention is characterized by a multi-phase-locked loop which can generate a plurality of multi-phase clock signals by a multi-phase voltage controlled oscillater to detect the transition edge of the data signal data. Accordingly, multiple sets of control signals ($up_k/dn_k$) are generated. Therefore, phase error $\theta_e$ and voltage Vd of the multi-phase-locked loop can be adjusted to be nearly linear according to the output control signals. This prevents the multiphase-locked loop from having dead zone. Furthermore, the clock jitter can be reduced and provide greater tolerance for data random jitter.

To achieve the aforementioned object, a multi phase-locked loop for data recovery in accordance with the invention includes a phase detector, a charge pump, a loop filter and a voltage controlled oscillator (VCO).

The phase detector is constituted by N phase detection units ($U_1, U_2, \ldots, U_N$, N is even, $N \geqq 4$). The phase detection units are connected in cascade configuration, and each of the phase detection unit contains a data signal input terminal for receiving the data signal from outside; a clock signal input terminal for receiving the multi-phase clock signals ($CK_1, CK_2, \ldots, CK_N$) from outside; a delay signal input terminal for receiving the delay signal output from another phase detection unit; a delay signal output terminal for outputting the delay signal; and a charge/discharge control signal output terminal for outputting charge/discharge control signals. Each phase detection unit generates a delay signal ($D_1, D_2, \ldots, D_N$) according to the input data signal and the complement of the multi-phase clock signal.

The delay signal ($D_{j+1}$) generated by the $(j+1)_{th}$ phase detection unit is applied to the $j_{th}$ phase detection unit via the $j_{th}$ delay signal input terminal. The delay signal ($D_1$) generated by the first phase detection unit ($U_1$) is applied to the $N_{th}$ phase detection unit ($U_N$) via the $N_{th}$ delay signal input terminal. In addition, the $j_{th}$ phase detection unit ($U_j$'1≦j≦N'j is an integer) generates control signals ($dn_1$, $d_2$, . . . , $dn_{N/2}$, $up_{N/2}$, . . . , $up_2$) for the charge/discharge operations according to the delay signal ($D_j$) from the $j_{th}$ phase detection unit, the delay signal ($D_{j+1}$) from the $(j+1)_{th}$ phase detection unit, and the multi-phase clock signal ($CK_j$) which is applied to the $j_{th}$ phase detection unit. However, the $N_{th}$ phase detection unit ($U_N$) generates a charge control signal ($up_1$) according to the delay signal ($D_N$) from the $N_{th}$ phase detection unit, the delay signal ($D_1$) from the first phase detection unit, and the multi-phase clock signal ($CK_N$) which is applied to the $N_{th}$ phase detection unit.

The charge pump is constituted by N/2 charge and discharge units ($CP_1$, $CP_2$, . . . , $CP_{N/2}$), wherein the $k_{th}$ (1≦k≦N/2) charge and discharge unit ($CP_k$) receives the $k_{th}$ charge/discharge control signal ($up_k/dn_k$) from the above mentioned phase detector and generates a charge/discharge current $Ich_k$, which equals to $(w_k \times up_k - w_k \times dn_k)Iss$, wherein $w_k$ is a weighting value; Iss is a fixed current value; and $w_1 < w_2 < \ldots < w_{N/2}$. The total charge/discharge current (Ich) output from the charge pump equals to $Ich_1 + Ich_2 + \ldots Ich_k + \ldots + Ich_{N/2}$.

The VCO described above is a multi-phase VCO, it outputs N multi-phase clock signals ($CK_1, CK_1 \ldots CK_N$). These signals are applied to the phase detectors described above, respectively.

Under the circumstance described above, the phase difference between $CK_{j+1}$ and $CK_j$ is $2\pi/N$.

The multi-phase clock signal ($CK_{j+1}$) which is applied to the $(j+1)_{th}$ phase detection unit ($U_{j+1}$) and the multi-phase clock signal ($CK_j$) which is applied to the $j_{th}$ phase detection unit ($U_j$). In accordance with the invention, the relation between the phase error $\theta_e$ and the voltage Vd of the phase-locked loop can be adjusted to be nearly linear by employing these control signals. Therefore, a phase-locked loop without dead zone can be derived, which can reduce clock jitter and enhance the tolerance for data random jitter.

BRIEF DESCRIPTION OF THE DRAWINGS

The above and other objects and the features and effects of the present invention can be best understood by referring to the following detailed descriptions of the preferred embodiment and the accompanying drawings, in which.

DETAILED DESCRIPTION OF THE PREFERRED EMBODIMENTS

Before describing the preferred embodiment in accordance with the invention, it should be made clear that the loop filter in the multi-phase-locked loop of the invention are similar to that of the prior art and will not be explained here.

Figure 5:
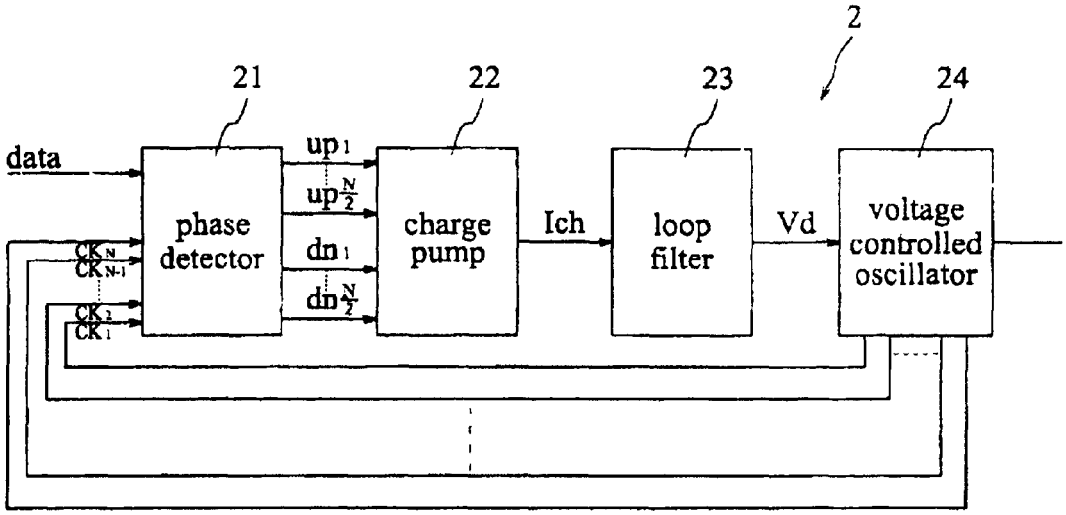
FIG. 5 is a block diagram showing a multi-phase-locked loop in accordance with the present invention.

Firstly, referring to FIG. 5, the multi-phase-locked loop for data recovery in accordance with the invention includes: a phase detector 21, a charge pump 22, a loop filter 23, and a multi-phase VCO 24.

Figure 6:
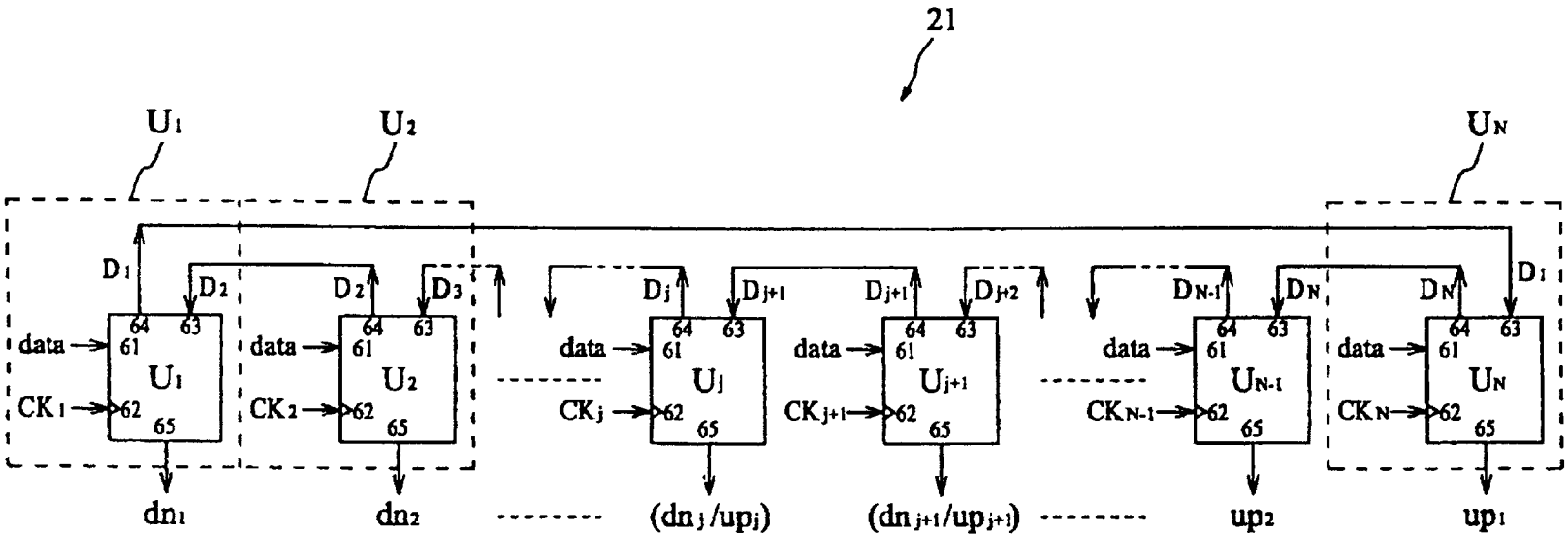
FIG. 6 is a block diagram showing a phase detector in accordance with the present invention.

As illustrated in FIG. 6, the phase detector 21 is constituted by N phase detection units ($U_1$, $U_2$, . . . , $U_N$), wherein N is even and N≧4. The phase detection units ($U_1$, $U_2$, . . . , $U_N$) are connected in cascade configuration, and each phase detection unit contains: a data signal input terminal 61 for receiving a data signal from outside; a clock signal input terminal 62 for receiving multiphase clock signals ($CK_1$, $CK_2$, . . . , $CH_N$) from outside; a delay signal input terminal 63 for receiving the output delay signal from another phase detection unit; a delay signal output terminal 64 for outputting a elay signal; and a charge/discharge control signal output terminal 65 for outputting charge/discharge control-signal.

Each phase detection unit ($U_1$, $U_2$ . . . $U_N$) generates a delay signal ($D_1$, $D_2$, . . . , $D_N$) according to the data signal data applied to the phase detection unit, and the complement of the multi-phase clock signals ($CK_1$, $CK_2$, . . . , $CK_N$). Moreover, the delay signal ($D_{j+1}$) generated by the $(j+1)_{th}$ phase detection unit ($U_{j+1}$) is applied to the $j_{th}$ phase detection unit ($U_j$) via the delay signal input terminal 63 in the $j_{th}$ phase detection unit ($U_j$). And the delay signal ($D_1$) generated by the first phase detection unit ($U_1$) is applied to the $N_{th}$ phase detection unit ($U_N$) via the delay signal input terminal 63 in the $N_{th}$ phase detection unit ($U_N$)

The $j_{th}$ phase detection unit ($U_j$, 1≦j<N, j is a positive integer) generates charge/discharge control signals ($dn_1$, $dn_2$, . . . , $dn_{N/2}$, $up_{N/2}$, . . . , $up_2$) according to the delay signal ($D_j$) from the $j_{th}$ phase detection unit ($U_j$), the delay signal ($D_{j+1}$) from the $(j+1)_{th}$ phase detection unit ($U_{j+1}$), and the multi-phase clock signal ($CK_j$) which is applied to the $j_{th}$ phase detection unit ($U_j$). The $N_{th}$ phase detection unit generates a charge control signal ($up_1$) according to the delay signal ($D_n$) from the $N_{th}$ phase detection unit ($U_N$), the delay signal ($D_1$) from the first phase detection unit ($U_1$), and the multi-phase clock signal ($CK_N$) which is applied to the $N_{th}$ phase detection unit ($U_N$).

As described above, the multi-phase clock signal ($CK_{j+1}$) is applied to the $(j+1)_{th}$ phase detection unit ($U_{j+1}$) and the multi-phase clock signal ($CK_j$) is applied to the $j_{th}$ phase detection unit ($U_j$). The phase difference between the two signals is $2\pi/N$. Moreover, as described above, the plurality of multi-phase clock signals ($CK_1$, $CK_2$, . . . , $CK_N$) are generated by the VCO 24.

Figure 7:
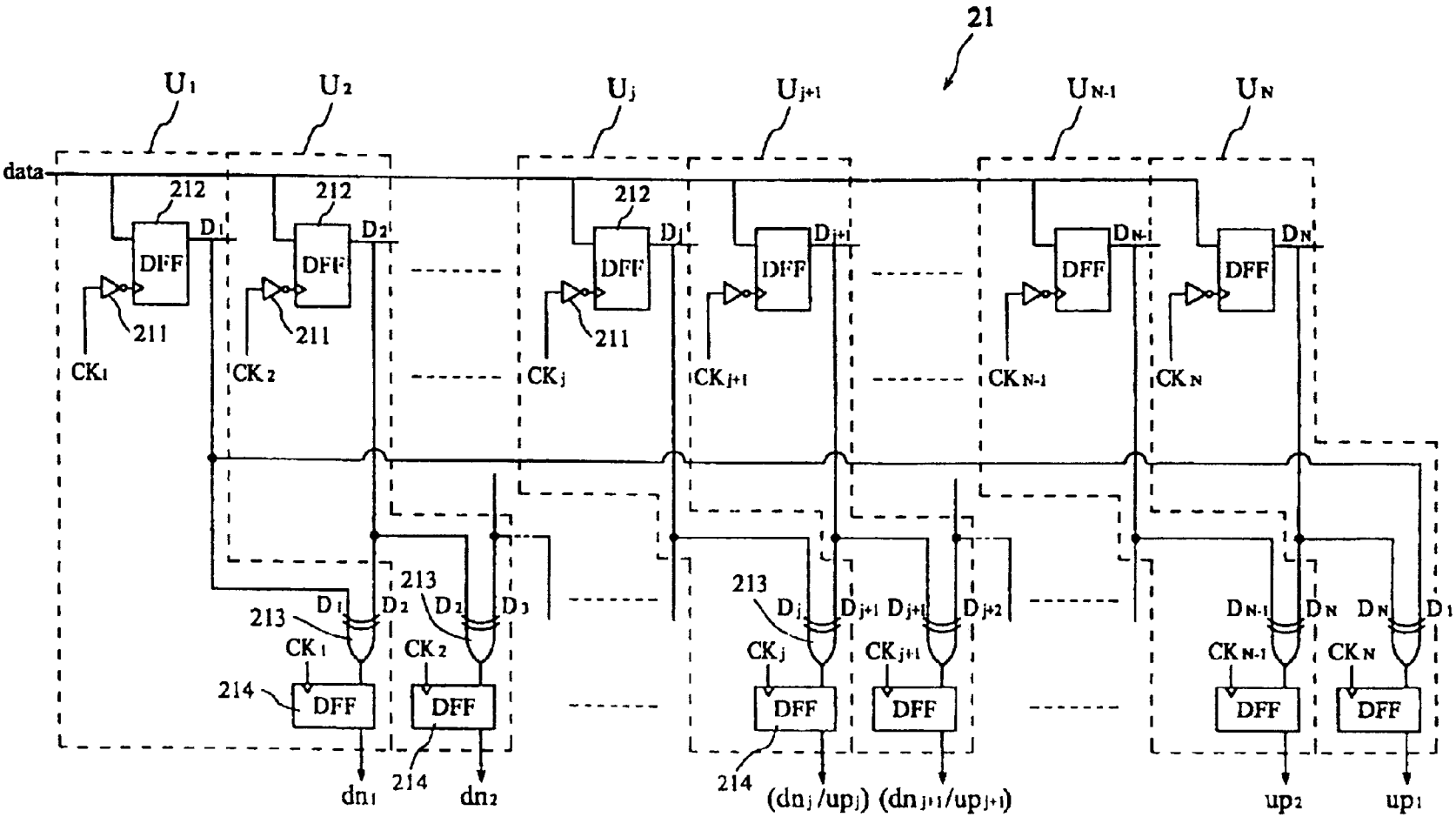
FIG. 7 is a detailed circuit showing a phase detector in accordance with the present invention.

Furthermore, FIG. 7 is utilized to illustrate the detailed circuit of phase detector 21 in accordance with the invention. As shown in FIG. 7, each phase detection unit ($U_1$, $U_2$, . . . , $U_N$) of the phase detector 21 in accordance with the invention includes: an inverter 211, a first flip-flop 212, an exclusive OR gate 213, and a second flip-flop 214. The inverter 211 inverts the multi-phase clock signals ($CK_1$, $CK_2$, . . . , $CK_N$) before these signals are applied to each first flip-flop 212, respectively. Each of the first flip-flops 212 generates a delay signal D. ($1 \leqq i \leqq N$)according to the above mentioned data signal data, and the multi-phase clock signal which has been inverted by the inverter 2. The delay signal ($D_j$) from the first flip-flop 212 and the delay signal ($D_{j+1}$) from the first flip-flop 212 in next phase detection unit, are both applied to the exclusive OR gate 213. The second flip-flop 214 generates charge/discharge control signals ($dn_1$, $dn_2$, . . . , $dn_{N/2}$, $up_{N/2}$, . . . , $up_2$) according to the above mentioned multi-phase clock signal and the signal output from the exclusive OR gate.

It should be mentioned that the charge control signal ($up_1$) is generated by the second flip-flop 214 of the $N_{th}$ sphase detection unit ($U_N$), which is based on the above described multi-phase clock signal ($CK_N$) and the output signal from its exclusive OR gate 213. The input signals of the exclusive OR gate 213 of the $N_{th}$ phase detection unit ($U_N$) are the delay signal ($D_1$) from the first phase detection unit ($U_1$) and the delay signal ($D_N$) from itself. In addition, the first flip-flop and the second flip-flop are both D flip-flops in this embodiment.

Figure 8:
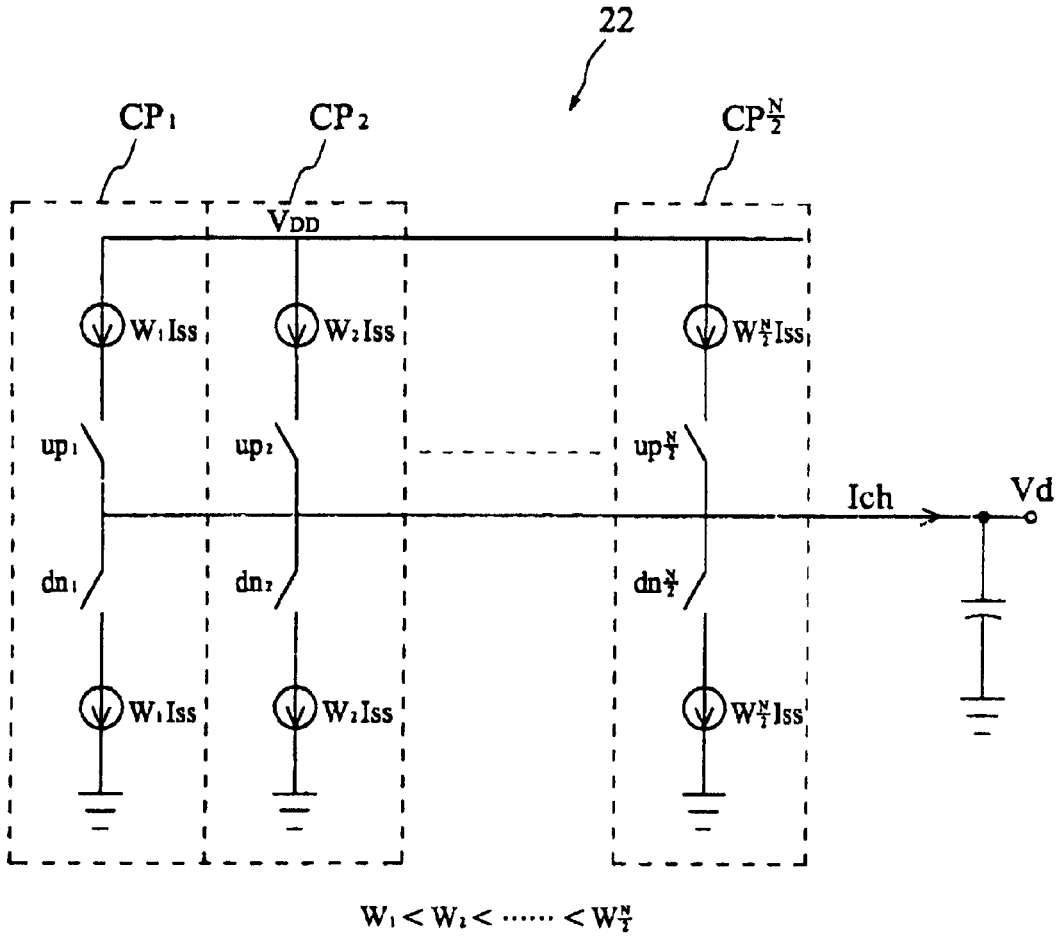
FIG. 8 is a detailed circuit showing a charge pump in accordance with the present invention.

As shown in FIG. 8, the charge pump 22 is constituted by N/2 charge and discharge units ($CP_1$, $CP_2$, . . . , $CP_{N/2}$). The $k_{th}$ charge and discharge unit $CP_k$ ($1 \leqq k \leqq N/2$) receives the $k_{th}$ charge/discharge control signal ($up_k$'$dn_k$) output from the phase detector 21 and generates a charge/discharge current $Ich_k$ according to the received signal. The charge/discharge current $Ich_k$ is determined by: $(w_k \times up_k - w_k \times dn_k)Iss$, wherein $w_k$ is a weighting value, Iss is a fixed current value, and $w_1 < w_2 < \ldots < w_N/2$. Therefore, the total charge/discharge current (Ich) output from charge pump 22 is:

$$Ich = Ich_1 + Ich_2 + \ldots Ich_k + \ldots + Ich_{N/2}$$

In other words, the total charge/discharge current (Ich) is:

$$Ich = \{[w_1 \times up_1 + w_2 \times up_2 + \ldots + w_{N/2} \times up_{N/2}] - [w_1 \times dn_1 + w_2 \times dn_2 + \ldots + w_{N/2} \times dn_{N/2}]\}Iss$$

A exemplified configuration of the multi-phase-locked loop is depicted below to further explain the method of using a couple of multi-phase clock signals.

[Exemplified Configuration]

Firstly it should be mentioned here, the preferred embodiment recited below includes ten phase detection units ($U_1$, $U_2$, . . . , $U_{10}$) in the phase detector 21.

Figure 9:
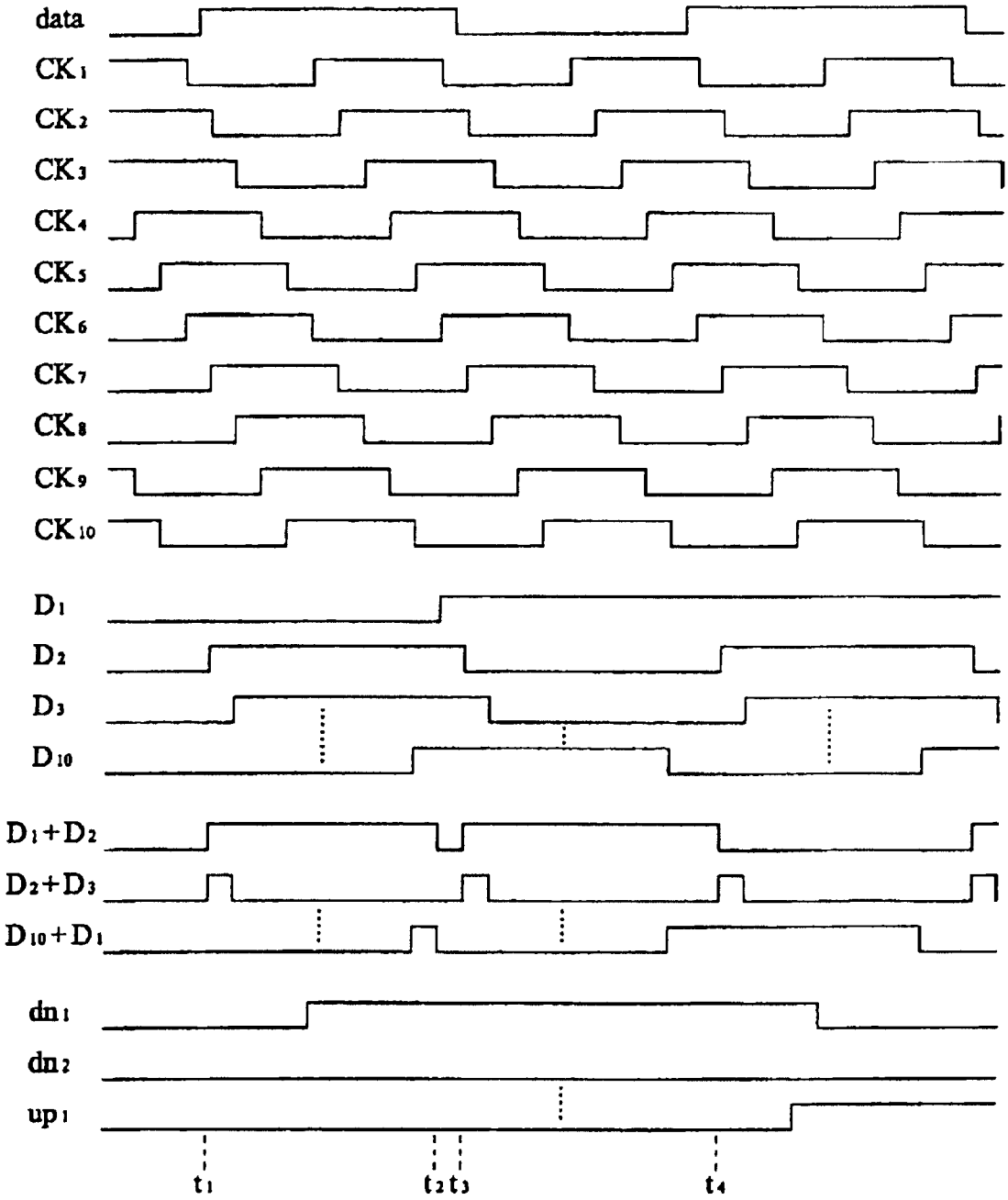
FIG. 9 is a state diagram showing the signals of data signal data employed in the multi-phase-locked loop, the multi-phase clock signals ($CK_1$, $CK_2$, . . . , $CK_{10}$), and the charge/discharge control signals ($up_k/dn_k$) used in the present invention.

Secondly, referring to FIG. 7, when the data signal data and the multi-phase clock signal ($CK_1$, $CK_2$, . . . , $CK_{10}$) shown in FIG. 9 are applied to each phase detection unit ($U_1$, $U_2$, . . . , $U_{10}$), the first flip-flop 212 of the first phase detection unit ($U_1$) outputs adelay signal ($D_1$); the first flip-flop 212 of the second phase detection unit ($U_2$) outputs a delay signal ($D_2$); . . . etc.

As described above, the delay signal ($D_1$) generated by the first phase detection unit ($U_1$) as well as the delay signal ($D_2$) generated by the second phase detection unit ($U_2$) cooperatively generate an output signal ($D_1 \oplus D2$) via the exclusive OR gate 213 in the first phase detection unit ($U_1$). Similarly, the delay signal ($D_2$) generated by the second phase detection unit ($U_2$) as well as the delay signal ($D_3$) generated by the third phase detection unit ($U_3$) cooperatively generate an output signal ($D2 \oplus D3$) via the exclusive OR gate 213 in the second phase detection unit ($U_2$). However, the delay signal ($D_{10}$) generated by the tenth phase detection unit ($U_{10}$) as well as the delay signal ($D_1$) generated by the first phase detection unit ($U_1$) cooperatively generate an output signal ($D_1 \oplus D_1$) via the exclusive OR gate 213 in the tenth phase detection unit ($U_{10}$).

As described in the preceding paragraph, the second flip-flop 214 of the first phase detection unit ($U_1$) generates a discharge control signal ($dn_1$) according to the multi-phase clock signal ($CK_1$) and the output signal ($D_1 \oplus D_2$) from the exclusive OR gate 213. Similarly, the second flip-flop 214 of the second phase detection unit ($U_2$) generates a discharge control signal ($dn_2$) according to the multi-phase clock signal ($CK_2$) and the output signal ($D_2 \oplus D_3$) from the exclusive OR gate 213. Similarly as above, the third to fifth phase detection units ($U_3$~$U_5$) generates a discharge control signal ($dn_3$~$dn_5$), respectively. Furthermore, the sixth to ninth phase detection units ($U_6$~$U_9$) generates a charge control signal ($up_5$~$up_2$). The second flip-flop 214 of the tenth phase detection unit ($U_{10}$) generates a charge control signal ($up_1$) according to the multi-phase clock signal ($CK_{10}$) and the output signal from the exclusive OR gate 213. It should be mentioned here, due to the phase difference between two consecutive multi-phase clock signals of ($CK_1$, $CK_2$, . . . , $CK_{10}$) being $2\pi/10$, the phase detection unit ($U_1$, $U_2$, . . . , $U_{10}$) of the phase detection 21 respectively generate five discharge control signals ($dn_1$'$dn_2$'$dn_3$'$dn_4$'$dn_5$) and five charge control signals ($up_1$'$up_2$'$up_3$'$up_4$'$up_5$) in this preferred embodiment.

Referring to FIG. 8, the phase detector 21 in this preferred embodiment includes ten phase detection units ($U_1$, $U_2$, . . . , $U_{10}$), the charge pump 22 contains five charge and discharge units ($CP_1$, $CP_2$, . . . , $CP_5$). At this time, the charge/discharge control signals ($up_1$/$dn_1$'$up_2$/$dn_2$'$up_3$/$dn_3$'$up_4$/$dn_4$'$up_5$/$dn_5$) output from the phase detector 21 are respectively applied to the charge and discharge units ($CP_1$, $CP_2$, . . . , $CP_5$). If Ich(t) represents the total charge/discharge current of charge pump 22 at time t, Iss represents a fixed current value, and $w_1$~$w_5$ represent the weighting value of each charge and discharge unit, wherein $w_1 < w_2 < w_3 < w_4 < w_5$, then $$I_{ch}(t) = \{[w_1 \times up_1(t) + w_2 \times up_2(t) + w_3 \times up_3(t) + w_4 \times up_4(t) + w_5 \times up_5(t)] - [w_1 \times dn_1(t) + w_2 \times dn_2(t) + w_3 \times dn_3(t) + w_4 \times dn_4(t) + w_5 \times dn_5(t)]\}Iss$$

Figure 4:
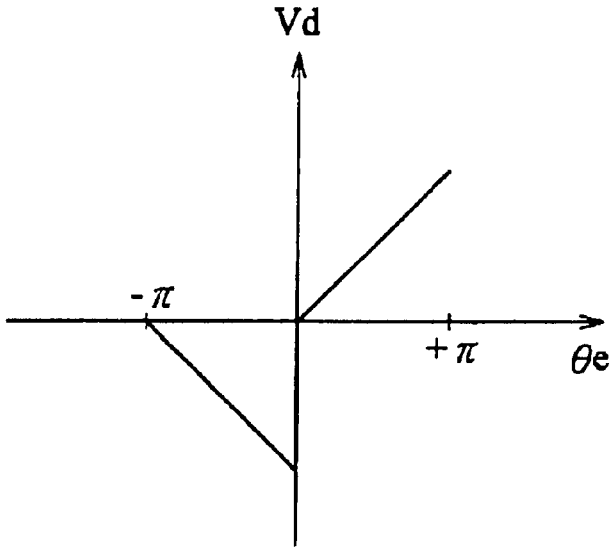
FIG. 4 depicts the relation between the phase error $\theta_e$ and voltage Vd by using a prior art phase detector.
Figure 10:
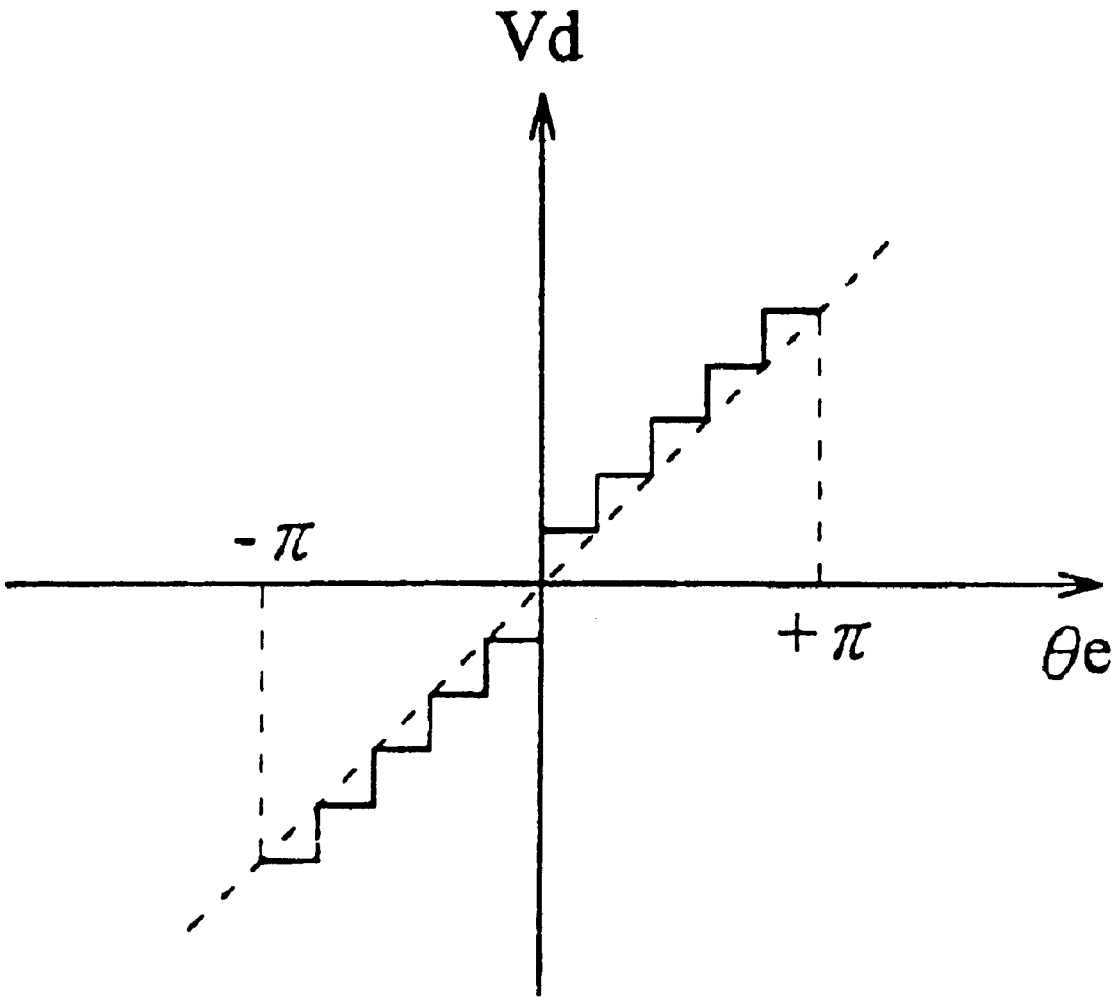
FIG. 10 depicts the relation between the phase error $\theta_e$ and voltage Vd in the multi-phase-locked loop in accordance with the present invention.

Consequently, it is obvious that the total charge/discharge current Ich output from the charge pump 22 displays a nearly linear variation in the multi-phase-locked loop of this preferred embodiment. Therefore, the phase error $\theta_e$ and the voltage Vd in the multi-phase-locked loop in accordance with the invention can be adjusted to be nearly linear (as shown in FIG. 10) according to those control signals. To sum up, there are some advantages in the multi-phase-locked loop in accordance with the invention, which are listed as follows:

1. From FIG. 10, it can be understood that there is no dead zone in the multi-phase-locked loop in accordance with the invention because all the up/dn are kept as a fixed time period. Therefore, enough loop signals (up or dn) can be generated even the phase error IIe is very small.
2. Due to the linear relation between Vd and $\theta_e$, a sudden voltage variation can be avoided. The condition illustrated in FIG. 4 can thus be prevented, and smaller recovering clock jitter can be acquired as well.

3. Larger tolerance for data random jitter can also be derived because lower recovering clock jitter can be acquired by the phase detector in accordance with the invention.

Figure 1:
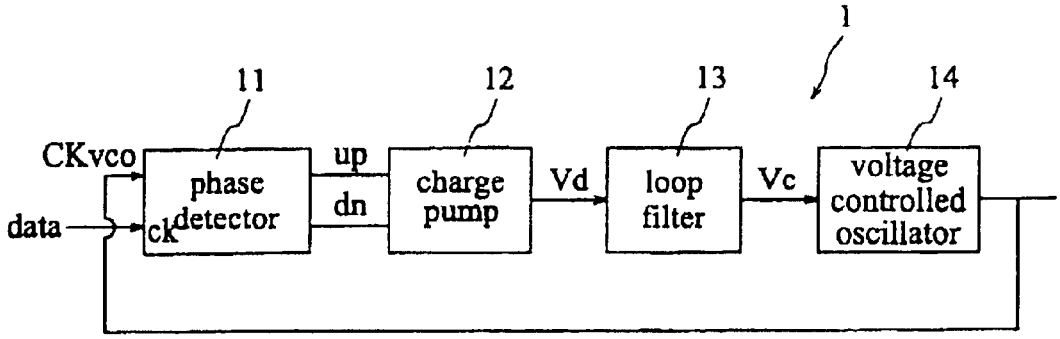
FIG. 1 (PRIOR ART)
FIG. 1 is a block diagram showing a prior art phase-locked loop for data recovery.
Figure 2A:
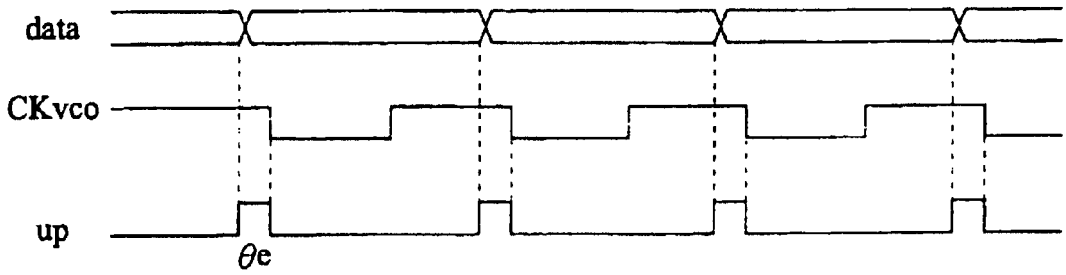
FIG. 2(a) is a clock diagram showing the control signal (up) generated by a prior art phase detector when the transition edge of the data signal data leads the falling edge of the clock signal $CK_{vco}$.
Figure 2B:
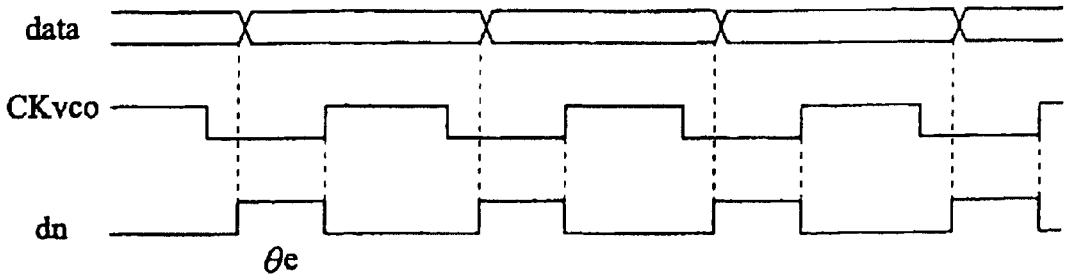
FIG. 2(b) is a clock diagram showing the control signal (dn) generated by a prior art phase detector when the transition edge of the data signal data lags behind the falling edge of the clock signal $CK_{vco}$.
Figure 3:
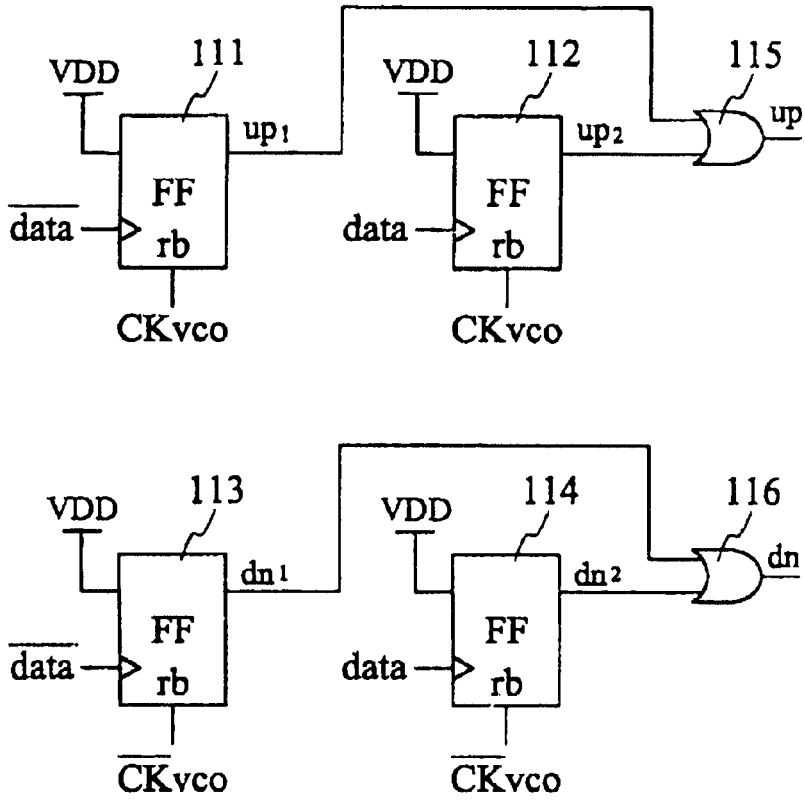
FIG. 3 depicts a circuit of a prior art phase detector.

4. When the conventional phase detector 11 as illustrated in FIG. 1 is used to recover the data, another flip-flop needs to be incorporated to read the data in a steady locked phase. Therefore, the problems such as device coupling, parasitic capacitance and delay effects cannot be avoided, which is called static phase error. On the other hand, it is unnecessary to add another flip-flop to read the data in a steady locked phase by using $CK_6$ to recover (read) data directly in the phase detector according to the invention to get the best recovered data ($D_6$, not shown in the figure).

The-exemplified configuration and the preferred embodiment described in the description are only illustrative and are not to be construed as limiting the invention. Various modifications and applications can be made without departing from the true spirit and scope of the invention as defined by the appended claims.

What is claimed is:

1. A multi-phase-locked loop for data recovery comprising a phase detector, a charge pump, a loop filter and a voltage controlled oscillator, wherein:

said phase detector is constituted by N phase detection units ($U_1, U_2, \ldots, U_N$, N is even, $N \geqq 4$); said N phase detection units are connected in cascade configuration, and each phase detection unit contains:

a data signal input terminal for receiving a data signal from outside;

a clock signal input terminal for receiving [the] *one of* multi-phase clock signals ($CK_1, CK_2, \ldots, CK_N$) from outside;

a delay signal input terminal for receiving a delay signal output from another phase detection unit;

a delay signal output terminal for outputting a delay signal *of the phase detection unit*; and a charge/discharge control signal output terminal for outputting *a* control signals for charge/discharge operations;

each of said N phase detection units generates a delay signal ($D_1, D_2, \ldots, D_N$) according to [an input] *the* data signal and the complement of [a] *the* multi-phase clock signal; the delay signal ($D_{j+1}$) generated by the $(j+1)_{th}$ phase detection unit is input into the $j_{th}$ phase detection unit via the $j_{th}$ delay signal input terminal; the delay signal ($D_1$) generated by the first phase detection unit is input into the $N_{th}$ phase detection unit via the $N_{th}$ delay signal input terminal;

the $j_{th}$ phase detection unit ([$U_j$]$U_j$, $1 \leqq j < N$, j is a positive integer) generates *one of the* control signals ($dn_1, dn_2, \ldots, dn_{N/2}, up_{N/2}, \ldots, up_2$) for charge/discharge operations according to the delay signal ($D_j$) from the $j_{th}$ phase detection unit, the delay signal ($D_{j+1}$) from the $(j+1)_{th}$ phase detection unit, and the multi-phase clock signal ($CK_j$) which is applied to the $j_{th}$ phase detection unit;

the $N_{th}$ phase detection unit generates a charge control signal ($up_1$) according to the delay signal ($D_n$) from the $N_{th}$ phase detection unit, the delay signal ($D_1$) from the first phase detection unit, and the multi-phase clock signal ($CK_N$) which is applied to the $N_{th}$ phase detection unit;

said charge pump being constituted by N/2 charge and discharge units ($CP_1, CP_2, \ldots, CP_{N/2}$), wherein the $k_{th}$ ($CP_k$, $1 \leqq k \leqq N/2$) charge and discharge unit ($CP_k$) is employed to receive the $k_{th}$ charge/discharge control signal set ($up_k/dn_k$) from said phase detector, and a current $Ich_k$ is generated by the charge/discharge control signal set ($up_k/dn_k$); the charge/discharge current $Ich_k = (w_k \times up_k - w_k \times dn_k)Iss$, wherein $w_k$ is a weighting value, Iss is a fixed current value, and $w_1 < w_2 < \ldots < w_{N/2}$; the total charge/discharge current (Ich) from said charge pump equals to $Ich_1 + Ich_2 + \ldots Ich_k + \ldots + Ich_{N/2}$; and said voltage controlled oscillator is a multi-phase voltage controlled oscillator, which outputs N multi-phase clock signals ($CK_1, CK_2 \ldots, CK_N$), which are applied to said [phase detectors] *phase detection units*, respectively.

2. The multi-phase-locked loop for data recovery as described in claim 1, wherein the phase difference between the multi-phase clock signal ($CK_{j+1}$) input to the $(j+1)_{th}$ phase detection unit ($U_{j+1}$) and the multi-phase clock signal ($CK_j$) input to the $j_e$ phase detection unit ($U_j$) equals to $2\pi/N$.

3. The multi-phase-locked loop for data recovery as described in claim 1, wherein each of said N phase detection unit comprises: an inverter, a first flip-flop, an exclusive OR gate, and a second flip-flop;

said inverter inverting multi-phase clock signal which is to be input to each phase detection unit; the first flip-flop generating a delay signal according to the complementary multi-phase clock signal from said inverter and the data signal; the delay signal from said first flip-flop and the delay signal from the first flip-flop in another phase detection unit being input to the exclusive OR gate; the second flip-flop generating a charge/discharge control signal according to the multi-phase clock signal and the output signal from said exclusive OR gate.

4. The multi-phase-locked loop for data recovery as described in claim 3, wherein said first flip-flop and said second flip-flop are D flip-flops.

*5. A multi-phase-locked loop comprising:*

*a phase detector configured to:*

*receive a data signal and a plurality of multi-phase clock signals;*

*detect a phase difference between the data signal and each multi-phase clock signal; and*

*output a plurality of control signals;*

*a charge pump, configured to receive the control signals and produce a total control current according to the control signals, the charge pump comprising a plurality of charge/discharge units, wherein at least one of charge/discharge units comprises a first current source, a second current source, and a switch module, and wherein each charge/discharge unit has a weighting value, and at least two of the weighting values are different;*

*a loop filter configured to receive the total control current and produce a control voltage according to the total control current; and*

*a voltage controlled oscillator (VCO) configured to produce the multi-phase clock signals according to the control voltage, wherein the multi-phase clock signals are at substantially the same frequency.*

*6. The multi-phase-locked loop of claim 5, wherein the charge pump is controlled by the control signals such that the relation between the control voltage and the phase difference of the multi-phase-locked loop is adjusted to be nearly linear.*

*7. The multi-phase-locked loop of claim 5, wherein the control signals are maintained as a fixed time period such that a dead zone of the multi-phase-locked loop is reduced.*

*8. The multi-phase-locked loop of claim 5, wherein the control signals are maintained as a fixed time period such that jitter of the multi-phase clock signal is reduced.*

*9. A multi-phase-locked loop comprising:*

*a phase detector configured to:*

*receive a data signal and a plurality of multi-phase clock signals;*

*detect a phase different between the data signal and each multi-phase clock signal; and*

*output a plurality of control signals;*

*a charge pump, configured to receive the control signals and produce a total control current according to the control signals;*

*said charge pump including a first current source, a second current source, and a switch module;*

*a loop filter configured to receive the total control current and produce a control voltage according to the total control current; and*

*a voltage controlled oscillator (VCO) configured to produce the multi-phase clock signals according to the control voltage, wherein the multi-phase clock signals are at substantially the same frequency, wherein the phase detector comprises N phase detection units (N is even, N>=4), the N phase detection units being coupled in cascade configuration.*

*10. The multi-phase-locked loop of claim 9, wherein a phase difference between a first multi-phase clock signal and a second multi-phase clock signal adjacent to the first multi-phase clock signal is $2\pi/N$.*

*11. The multi-phase-locked loop of claim 9, wherein each phase detection unit comprises:*

*a first flip-flop configured to generate a delay signal according to the corresponding multi-phase clock signal and the data signal;*

*an exclusive OR gate configured to receive the delay signal from the first flip-flop and another delay signal from another first flip-flop in another phase detection unit; and*

*a second flip-flop configured to output one of the plurality of control signals according to an output signal of the exclusive OR gate and the corresponding multi-phase clock signal.*

*12. The multi-phase-locked loop of claim 11, wherein the first flip-flop and the second flip-flop are D flip-flops.*

*13. The multi-phase-locked loop of claim 5, wherein each charge/discharge unit is configured to generate an output current according to the corresponding control signal,*

*wherein the charge pump is configured to receive the output currents and produce the total control current.*

*14. A phase detector for detecting phase differences between a data signal and a plurality of multi-phase clock signals and producing a plurality of control signals, wherein the frequencies of the multi-phase clock signals are substantially the same, the phase detector comprising:*

*a plurality of phase detection units, the phase detection units being coupled in cascade configuration, wherein each of the phase detection units comprises:*

*a first flip-flop configured to generate a delay signal according to the corresponding multi-phase clock signal and the data signal;*

*an exclusive OR gate configured to receive the delay signal from the first flip-flop and another delay signal from another first flip-flop in another phase detection unit; and*

*a second flip-flop configured to generate one of the plurality of control signals according to an output signal of the exclusive OR gate and the corresponding multi-phase clock signal.*

*15. The multi-phase-locked loop of claim 5, wherein the charge pump is configured to produce a plurality of output currents according to the control signals, and the charge pump is configured to produce the total control current according to the output currents.*

*16. The multi-phase-locked loop of claim 15, wherein each output current has a corresponding weighting value, and at least two of the weighting values are different.*

*17. The multi-phase-locked loop of claim 15, wherein the charge pump includes a plurality of switching devices controlled by the control signals, and the charge pump produces the output currents selectively through the switching devices.*

*18. The multi-phase-locked loop, comprising:*

*a phase detector configured to:*

*receive a data signal and a plurality of multi-phase clock signals;*

*detect a phase difference between the data signal and each multi-phase clock signal; and*

*output a plurality of control signals;*

*a charge pump, configured to receive the control signals and produce a total control current according to the control signals;*

*a loop filter configured to receive the total control current and produce a control voltage according to the total control current; and*

*a voltage controlled oscillator (VCO) configured to produce the multi-phase clock signals according to the control voltage, wherein the multi-phase clock signals are at substantially the same frequency;*

*wherein the charge pump comprises a plurality of charge/discharge units, each charge/discharge unit has a corresponding weighting value, and at least two of the weighting values are different.*

*19. The multi-phase-locked loop of claim 5, wherein the phase detector comprises:*

*a plurality of phase detection units, the phase detection units being coupled in cascade configuration, wherein each of the phase detection units comprises:*

*a first flip-flop configured to generate a delay signal according to the corresponding multi-phase clock signal and the data signal;*

*a logic circuit configured to receive the delay signal from the first flip-flop and another delay signal from another first flip-flop in another phase detection unit; and*

*a second flip-flop configured to generate one of the plurality of control signals according to an output signal of the logic circuit and the corresponding multi-phase clock signal.*

* * * * *